(12) United States Patent
Smith et al.

(10) Patent No.: US 8,775,990 B1
(45) Date of Patent: Jul. 8, 2014

(54) ALIGNMENT OF MICROARCHITECTURAL CONDITIONS

(71) Applicants: Peter J. Smith, Folsom, CA (US); Bharat S. Pillilli, El Dorado Hills, CA (US); Harikrishna B. Baliga, Folsom, CA (US); Michael S. Yu, Mountain View, CA (US); Shlomi Alkalay, Ramat-Gan (IL)

(72) Inventors: Peter J. Smith, Folsom, CA (US); Bharat S. Pillilli, El Dorado Hills, CA (US); Harikrishna B. Baliga, Folsom, CA (US); Michael S. Yu, Mountain View, CA (US); Shlomi Alkalay, Ramat-Gan (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/929,102

(22) Filed: Jun. 27, 2013

Related U.S. Application Data

(60) Provisional application No. 61/801,237, filed on Mar. 15, 2013.

(51) Int. Cl.
*G06F 9/455* (2006.01)
*G06F 17/50* (2006.01)

(52) U.S. Cl.
USPC .......................................................... 716/108

(58) Field of Classification Search
USPC .......................................................... 716/108
See application file for complete search history.

(56) References Cited

U.S. PATENT DOCUMENTS 7,448,004 B1 * 11/2008 Brown ........................ 716/106
2011/0257955 A1 * 10/2011 Bertacco et al. ............... 703/15

* cited by examiner

*Primary Examiner* — Suresh Memula
(74) *Attorney, Agent, or Firm* — Patent Capital Group

(57) ABSTRACT

Techniques for controlling alignment of conditions between modular functional blocks in an integrated circuit having a hierarchical network of modular functional blocks. The output of each functional block can be logically determined by its external inputs combined with internal state feedback and internal state and is derived from a pattern of prior external inputs. Alignment of output conditions from independent and interdependent functional blocks within the hierarchical network of functional blocks is induced to provide unique conditions by modifying internal state and timing alignments with internal data and internal controls within one or more of the modular functional blocks. Functional outputs from one or more of the modular functional blocks can be monitored based on the modified internal state and timing alignments. Pattern results can be generated based on the monitoring. Test results based on the pattern results can be stored.

20 Claims, 7 Drawing Sheets

ALIGNMENT OF MICROARCHITECTURAL CONDITIONS

PRIORITY

This application claims priority to U.S. Provisional Patent Application No. 61/801,237, entitled "ALIGNMENT OF MICROARCHITECTURAL CONDITIONS" by Peter J. Smith and Bharat S. Pillilli, filed Mar. 15, 2013.

TECHNICAL FIELD

Embodiments of the invention relate to alignment of microarchitectural conditions. More particularly, embodiments of the invention relate to techniques to modulate alignment of microarchitectural conditions through customized pipeline behavior.

BACKGROUND

Typical test methodologies rely on external data to set up corner case interactions, which extensively covers more accessible logic while infrequently covering many deeply-seeded internal states. A rare corner case cause by the simultaneous occurrence of a relatively small number of common internal states may take weeks or even months to hit during post-silicon testing and may even take years if another condition is added. This problem worsens with increased internal complexity and decreased interfaces due to increased integration. All of this makes highly integrated circuit designs progressively susceptible to silicon escapes.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

A highly integrated circuit is typically a network of modular functional blocks (FUBs), where a FUB can contain a hierarchy of lower-level FUBs. The output of each FUB can be logically determined by its external inputs combined with any internal state feedback, where the internal state is derived from the pattern of prior external inputs over time.

Figure 1:
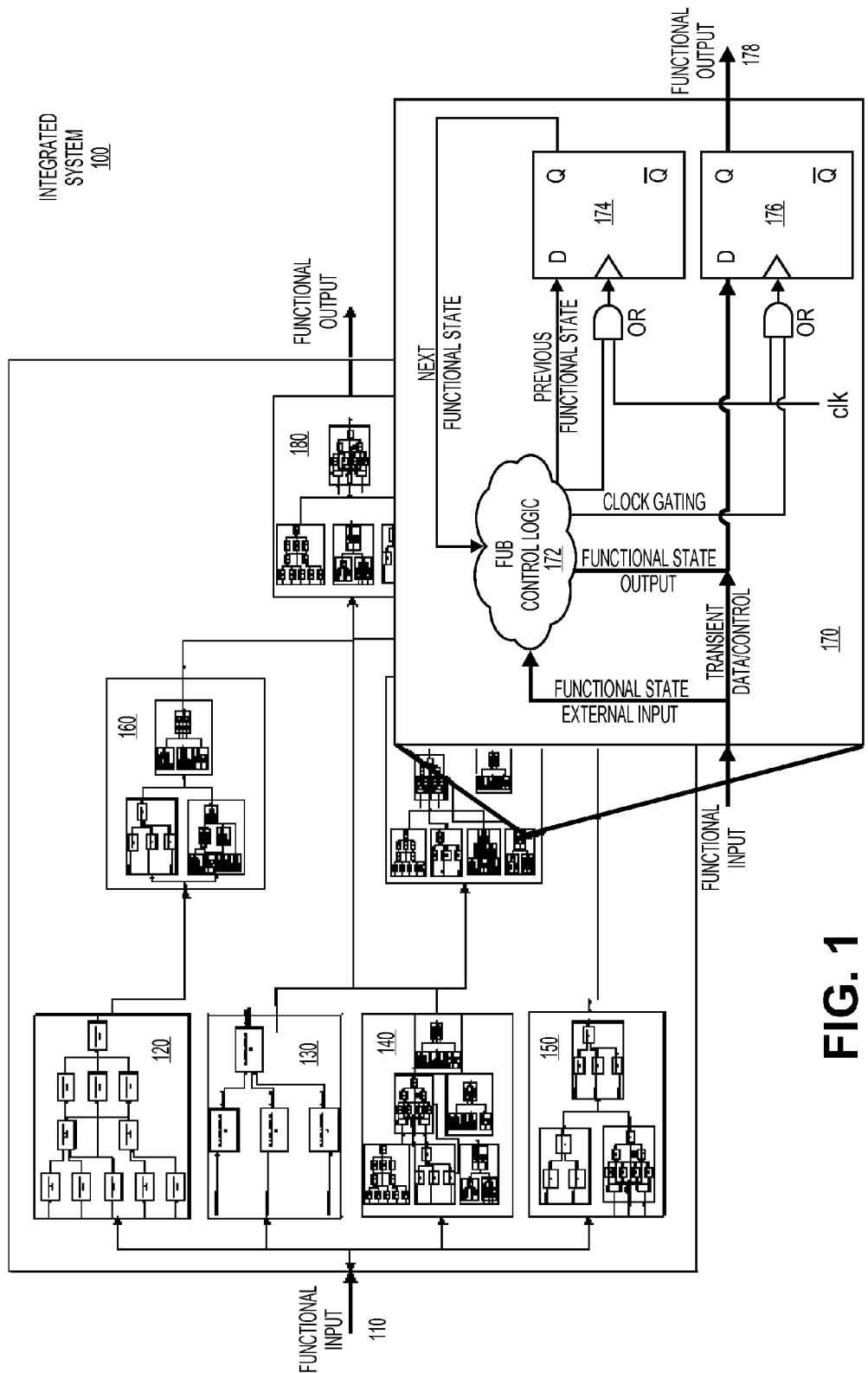
FIG. 1 is a block diagram of one embodiment of a portion of a highly integrated circuit having a hierarchy of functional blocks.

FIG. 1 is a block diagram of one embodiment of a portion of a highly integrated circuit having a hierarchy of functional blocks. The functional blocks of FIG. 1 can be, for example, one or more components of a mobile electronic system (e.g., tablet device, mobile phone), which may be illustrated in one or more of the figures below. The example of FIG. 1 illustrates a relatively small number of FUBs; however, the techniques described herein can be applied to circuits with any number of FUBs.

Integrated system 100 includes multiple FUBs that may be arranged in a hierarchical manner. For example, first-level FUBs 120, 130, 140 and 150 can be coupled to receive functional input 110. First-level FUBs can provide any type of functionality based on functional input 110.

Each of FUBs 120, 130, 140 and 150 provide intermediate output signals that provide input to FUBs 160 and 170. FUBs 160 and 170 operate on the intermediate signals to provide input to FUB 180, which generates functional output 190.

Using FUB 170 as an example, FUB control logic 172 can operate to control the timing of functional output 178 that is provided to other FUBs. By controlling the timing of the output from the FUBs, testing conditions can be controlled to provide improved and more efficient testing. Any number of FUBs can include FUB control logic as described with respect to FIG. 1.

In one embodiment, FUB control logic 172 receives next functional state from latch 174 and FUB control logic 172 provides a previous functional state to latch 174. In one embodiment, latch 176 receives a signal from FUB logic and latches functional output 178. The example of FIG. 1, illustrates only two latches for reasons of simplicity only; any number of latches may be utilized.

In one embodiment, FUB control logic 172 can be referred to as a functional state machine (FSM). In one embodiment, a FUB's FSM is based on the entire internal state that may impact a FUB's output, which includes all lower-level FSMs.

For example, a multi-core system is a FUB with a high-level FSM where internal state is the value of all latches/flops within the system. The most elusive internal states occur due to deeply-seeded corner case interactions. While the external input to the system is directly accessible, high-level FSM complexity restricts transitions to lower-level internal states. Conversely, a low-level FUB's inputs are inaccessible, while its FSM is simplified to a single pipe stage. In general, the input to each intermediate level can include signals from multiple independent FUBs with varying FSM transition latencies. Accessibility to each successive level is restricted by the complexity of aligning higher-level FSMs.

If a testing environment had complete control of a FUB's inputs, then the testing environment could eventually provide any possible output from the FUB. Further, if the testing environment had control of the FUB's FSM, the testing environment could provide the output in a known clock cycle.

Figure 2:
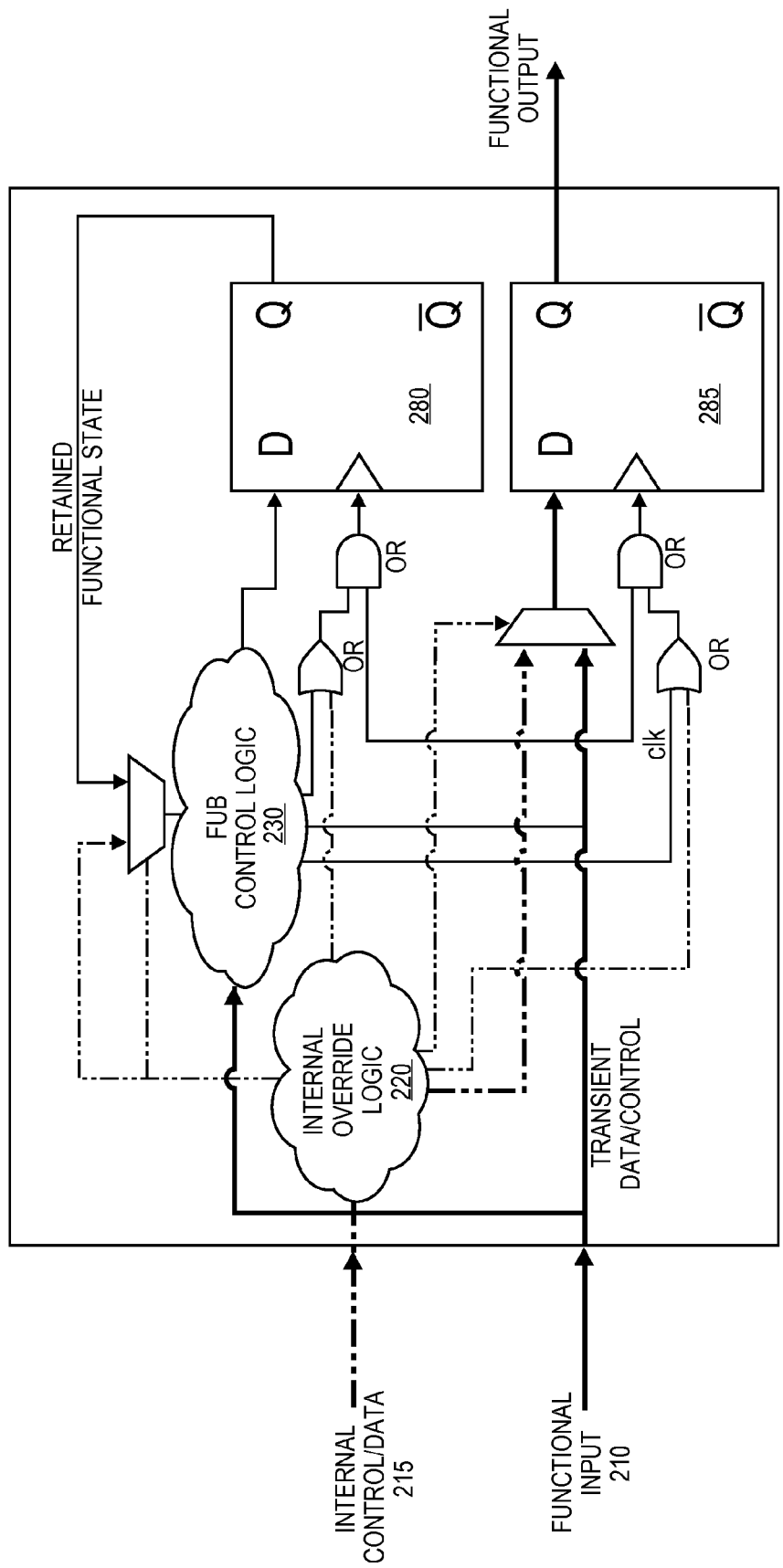
FIG. 2 is a block diagram of one embodiment of a functional block completely controlled by internal overrides.

FIG. 2 is a block diagram of one embodiment of a functional block completely controlled by internal overrides. Alternatively, a smaller number of targeted internal overrides can provide a majority of the internal accessibility, and the mechanism can be applied to any intermediate level.

Rather than line up all necessary conditions strictly through external patterns, internal override logic 220 and FUB control logic 230 can provide the ability to access deep levels of internal state through induced alignment of independent and interdependent FUBs. By influencing the pipeline behavior and/or functional state of successive modular blocks of logic with internal controls, external input (e.g., functional input 210 and/or internal control/data 215) can be used to provide testing conditions for all FUBs in a system including the least accessible FUBs.

In the example of FIG. 2, FUB 200 includes functional logic (not illustrated) as well as internal override logic 220 that is coupled to receive internal control/data signals 215 from a source outside FUB 200. In one embodiment, internal override logic 220 is coupled to provide control signals to latches 280 and 285 and/or to one or more multiplexors or logic gates within FUB 200. In one embodiment, internal override logic 220 provides signals to FUB control logic 230.

FUB control logic 230 receives functional input 210 and provides control signals to latches 280 and 285 and/or to one or more multiplexors or logic gates within FUB 200. FUB control logic 230 and internal override logic 220 operate together to provide the ability, based on internal control/data signals 215 and functional input signals 210, to provide conditions within FUB 200 and/or through functional output 290 for functional testing that would not otherwise be accessible.

In one embodiment, input patterns can be aligned with functional test input to set up unique conditions at targeted internal interfaces and/or alignment can be periodically (or randomly) modified. This allows for the ability to deterministically adjust natural behavior towards rare internal states based on coverage requirements. This also allows testing of inaccessible states, such as those dependent on clock domain crossing behavior when the required frequency ratios are not yet available, or even the capability to internally initiate functional behavior.

Figure 3:
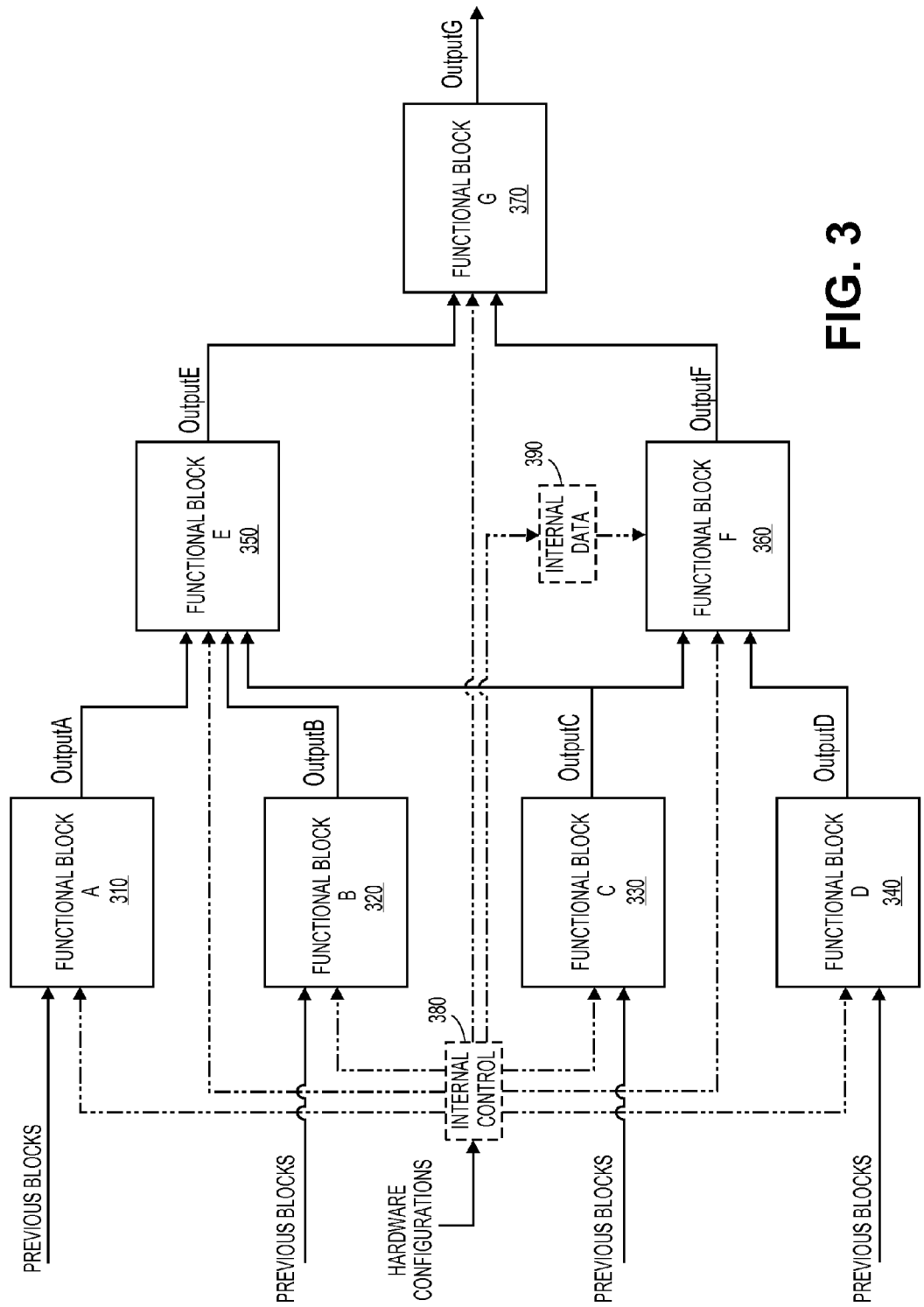
FIG. 3 is a high-level conceptual diagram of a hierarchical connection of functional blocks.

FIG. 3 is a high-level conceptual diagram of a hierarchical connection of functional blocks. In the example of FIG. 3, each FUB either represents a lower-level FUB hierarchy or a bottom level FUB. The example of FIG. 3 provides a simple example. Any number of FUBs can be supported.

In the example of FIG. 3, FUBs 310, 320, 330 and 340 receive input signals from previous blocks that are not illustrated in FIG. 3. FUBs 350 and 360 are coupled to receive input signals from FUBs 310, 320, 330 and 340. FUB 370 is the final FUB in the example of FIG. 3 and is coupled to receive input signals from FUBs 350 and 360. Internal control logic 380 is coupled to receive hardware configuration information and is coupled with all of the FUBs of FIG. 3. Internal data logic 390 is coupled to receive input from internal control logic 380 and to provide input to FUB 360. Internal control logic 380 and/or internal data logic 390 can operate to stall independent FUBs to line up conditions for testing purposes.

As a generic example, FUB 350 can receive aligned output from FUBs 310, 320 and 330. Through controlled backpressure, the outputs from FUBs 310, 320 and/or 330 can be delayed from specific input FUBs to deliver aligned input to FUB 350. The FUBs can be defined at a high enough level to be practical in which case multiple FUBs can have common dependencies, so the ability to inject internal data (for example from internal data logic 390) and/or override FSM states is provided to specific FUBs to simplify output synchronization and/or break dependencies where needed. In one embodiment, hardware configurations that are used to set up this control can be independently accessed through various methods (e.g., internal control registers, ucode/pcode, SBFT, random number generation).

As another example, FUB 370 handles memory controller arbitration for PCI traffic and the preceding input blocks represent control for various arbitration conditions. Prior to memory controller integration these FUBs could be tested independently, but with increased integration the inputs to each FUB are dependent on the output of other FUBs. Using the techniques and mechanisms described herein, not only can the higher levels of internal state (e.g., internal arbitration between PCI commands) but lower levels of internal state can be influenced and be dependent upon alignment of higher level FUBs (e.g., 310, 320, 330, 340).

In one embodiment, to test a specific coherency protocol, for example, internal memory requests and caches can be set up to explicitly write back a cache line that is snooped by the first inserted PCI command while in transition. Another level may use this condition to be aligned with an implicit partial writeback from a previous PCI command, and another may use this condition with a simultaneous graphics loop. Some conditions such as throttling behavior at clock domain crossings can also be frequency dependent, and the frequency ratios needed to test these conditions may not be available until very late in the process. The internal controls described herein not only allow natural alignment of coherency conditions, but also provide an ability to test multiple frequency conditions.

Figure 4:
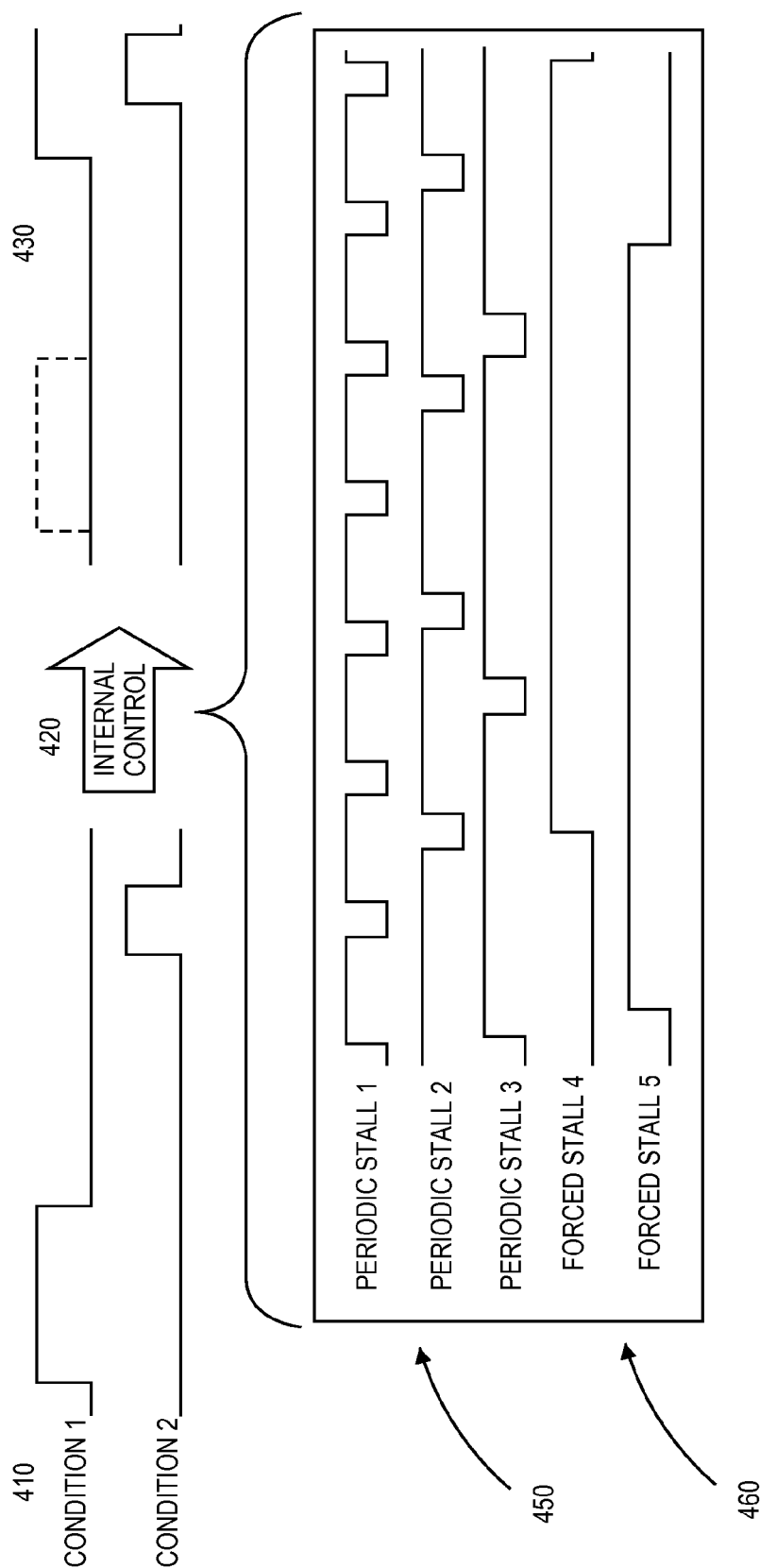
FIG. 4 is a timing diagram that illustrates periodic stall behavior that can be used to increase the likelihood of delivering aligned input to a selected functional block.

FIG. 4 is a timing diagram that illustrates periodic stall behavior that can be used to increase the likelihood of delivering aligned input to a selected functional block. For usage models such as functional validation, the mechanisms described herein can be used to deterministically increase the likelihood of alignment and testing that is less susceptible to architectural changes. This can be used to influence transaction flows that periodically line up conditions that adjust coverage towards corner case interactions.

Conditions 410 illustrate original conditions from external inputs (e.g., other FUBs, inputs), which can be influenced by internal control 420 to provide modified conditions 430. Internal control 420 can be provided by one or more of the mechanisms described above. Thus, modified conditions 430 provide different testing conditions than original conditions 410. Example internal controls can include biasing 450, which inserts periodic stalls to change timing conditions and forced stalls 460 that are based on conditions an can be one-time stalls.

Figure 5:
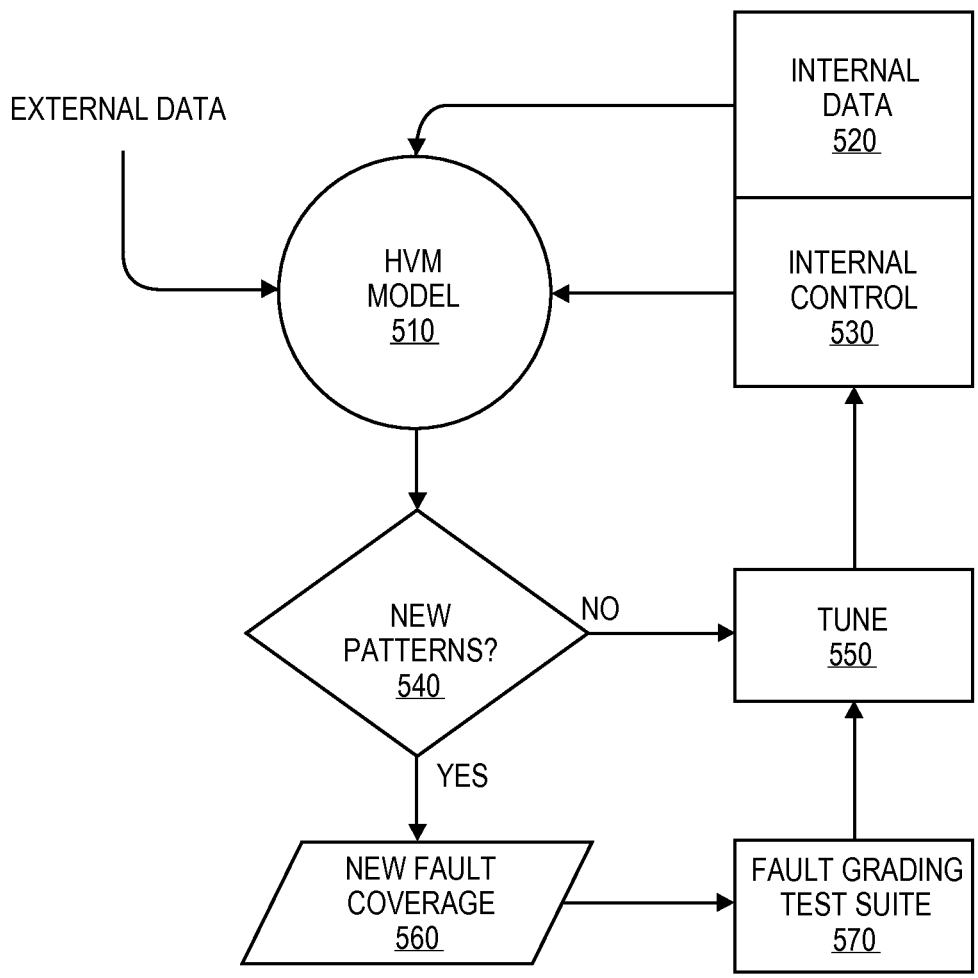
FIG. 5 is a flow diagram for testing using the techniques described herein.

FIG. 5 is a flow diagram for testing using the techniques described herein. The example of FIG. 5 provides a relatively simple testing strategy. More complex testing can be accomplished using the techniques described herein.

External data can be provided to high-volume manufacturing (HVM) model that is used for testing, 510. Other modeling can also be used for testing. In on embodiment, internal data 520 and/or internal control 530 can be provided to the HVM model as described in greater detail above.

The HVM model determines if new patterns have been detected, 540. If no new patterns are detected, 540, the internal control data are tuned, 550. This provides different conditions for testing. See, for example, the explanation with respect to FIG. 4, above. If new patterns are detected, 540, new fault coverage is provided, 560. A fault grading test suite can be used on the new fault coverage, 560. Output from the fault grading test suite can be used for further tuning, 550.

The techniques described herein can be utilized to test functional blocks that are designed to provide, for example, an interconnect fabric architecture. One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices.

PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 6:
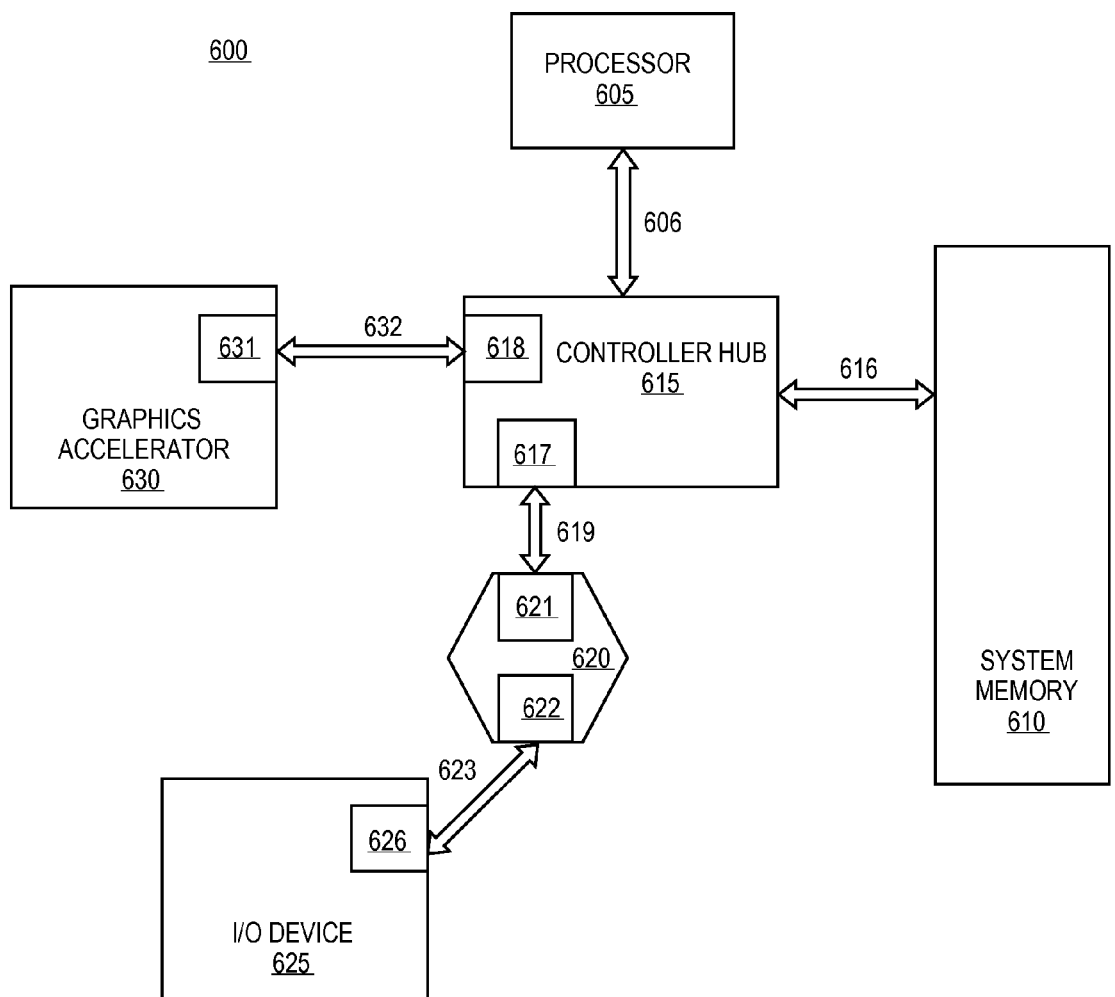
FIG. 6 an embodiment of a fabric composed of point-to-point links that interconnect a set of components.

Referring to FIG. 6, an embodiment of a fabric composed of point-to-point Links that interconnect a set of components is illustrated. System 600 includes processor 605 and system memory 610 coupled to controller hub 615. Processor 605 includes any processing element, such as a microprocessor, a host processor, an embedded processor, a co-processor, or other processor. Processor 605 is coupled to controller hub 615 through front-side bus (FSB) 606. In one embodiment, FSB 606 is a serial point-to-point interconnect as described below. In another embodiment, link 606 includes a serial, differential interconnect architecture that is compliant with different interconnect standard.

System memory 610 includes any memory device, such as random access memory (RAM), non-volatile (NV) memory, or other memory accessible by devices in system 600. System memory 610 is coupled to controller hub 615 through memory interface 616. Examples of a memory interface include a double-data rate (DDR) memory interface, a dual-channel DDR memory interface, and a dynamic RAM (DRAM) memory interface.

In one embodiment, controller hub 615 is a root hub, root complex, or root controller in a Peripheral Component Interconnect Express (PCIe or PCIE) interconnection hierarchy. Examples of controller hub 615 include a chipset, a memory controller hub (MCH), a northbridge, an interconnect controller hub (ICH) a southbridge, a root controller/hub. Often the term chipset refers to two physically separate controller hubs, i.e. a memory controller hub (MCH) coupled to an interconnect controller hub (ICH). Note that current systems often include the MCH integrated with processor 605, while controller 615 is to communicate with I/O devices, in a similar manner as described below. In some embodiments, peer-to-peer routing is optionally supported through root complex 615.

Here, controller hub 615 is coupled to switch/bridge 620 through serial link 619. Input/output modules 617 and 621, which may also be referred to as interfaces/ports 617 and 621, include/implement a layered protocol stack to provide communication between controller hub 615 and switch 620. In one embodiment, multiple devices are capable of being coupled to switch 620.

Switch/bridge 620 routes packets/messages from device 625 upstream, i.e. up a hierarchy towards a root complex, to controller hub 615 and downstream, i.e. down a hierarchy away from a root controller, from processor 605 or system memory 610 to device 625. Switch 620, in one embodiment, is referred to as a logical assembly of multiple virtual PCI-to-PCI bridge devices. Device 625 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 625 may include a PCIe to PCI/PCI-X bridge to support legacy or other version PCI devices. Endpoint devices in PCIe are often classified as legacy, PCIe, or root complex integrated endpoints.

Graphics accelerator 630 is also coupled to controller hub 615 through serial link 632. In one embodiment, graphics accelerator 630 is coupled to an MCH, which is coupled to an ICH. Switch 620, and accordingly I/O device 625, is then coupled to the ICH. I/O modules 631 and 618 are also to implement a layered protocol stack to communicate between graphics accelerator 630 and controller hub 615. Similar to the MCH discussion above, a graphics controller or the graphics accelerator 630 itself may be integrated in processor 605.

Figure 7:
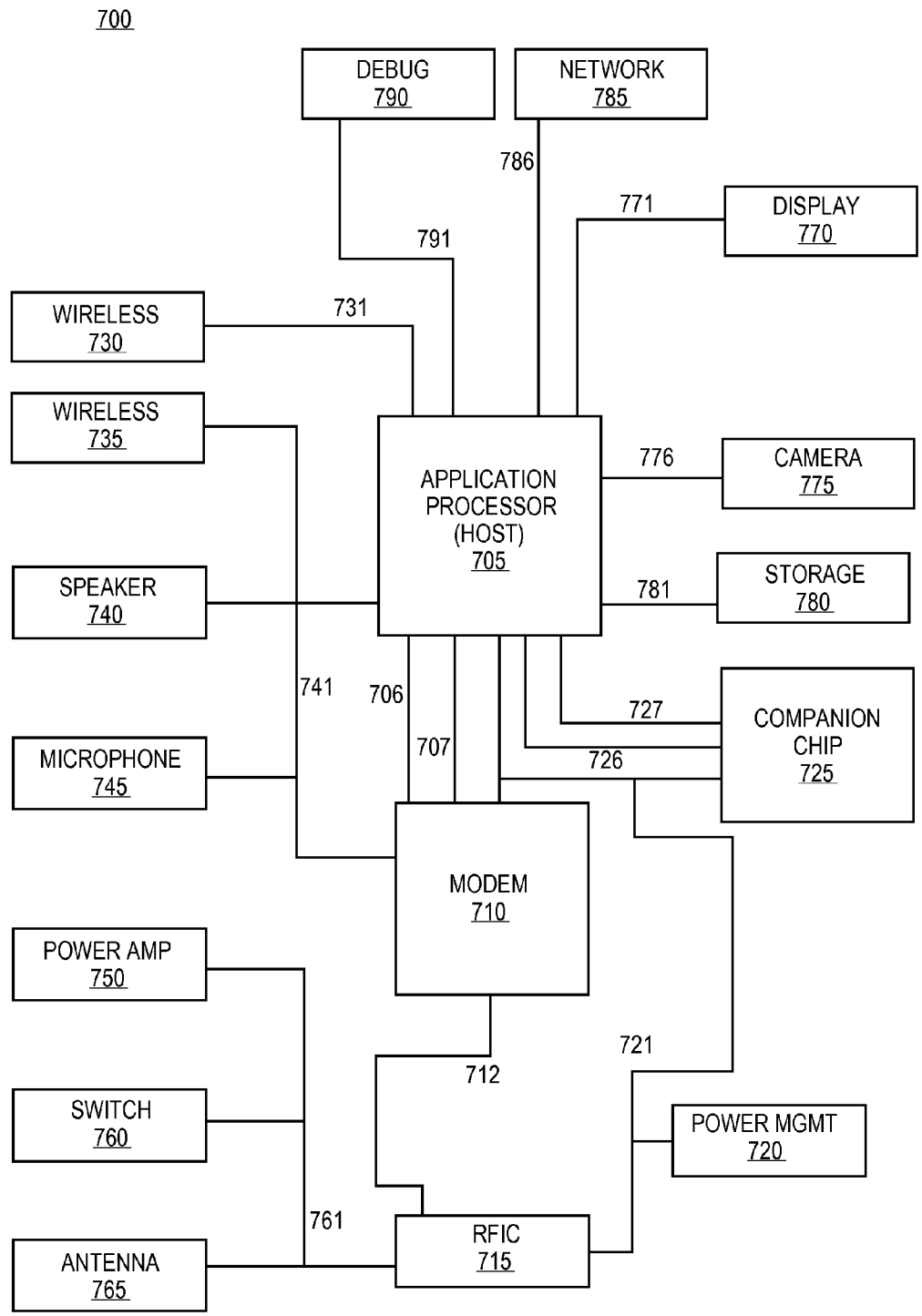
FIG. 7 illustrates an embodiment of a low power computing platform

The techniques described herein can be utilized to test functional blocks that are designed to provide, for example, one or more components of a computing platform. Referring to FIG. 7, an embodiment of a low power computing platform is depicted. In one embodiment, low power computing platform 700 includes a user equipment (UE). A UE refers to, in some embodiments, a device that may be used to communicate, such as a device with voice communication capability. Examples of a UE includes a phone, smartphone, tablet, ultraportable notebook, and a low power notebook. However, a low power computing platform may also refer to any other platform to obtain a lower power operating point, such as a tablet, low power notebook, an ultraportable or ultrathin notebook, a micro-server server, a low power desktop, a transmitting device, a receiving device, or any other known or available computing platform. The illustrated platform depicts a number of different interconnects to couple multiple different devices. Exemplary discussion of these interconnect are provided below to provide options on implementation and inclusion of apparatus' and methods disclosed herein. However, a low power platform 700 is not required to include or implement the depicted interconnects or devices. Furthermore, other devices and interconnect structures that are not specifically shown may be included.

Starting at the center of the diagram, platform 700 includes application processor 705. Often this includes a low power processor, which may be a version of a processor configuration described herein or known in the industry. As one example, processor 700 is implemented as a system on a chip (SoC). As a specific illustrative example, processor 700 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note as the processor and SoC technologies from these companies advance, more components illustrated as separate from host processor 700 may be integrated on an SoC. As a result, similar interconnects (and inventions therein) may be used "on-die."

In one embodiment, application processor 705 runs an operating system, user interface and applications. Here, application processor 705 often recognizes or is associated with an Instruction Set Architecture (ISA) that the operating system, user interface, and applications utilize to direct processor 705's operation/execution. It also typically interfaces to sensors, cameras, displays, microphones and mass storage.

Some implementations offload time critical telecom-related processing to other components.

As depicted, host processor 705 is coupled to a wireless interface 730, such as WLAN, WiGig, WirelessHD, or other wireless interface. Here an LLI, SSIC, or UniPort compliant interconnect is utilized to couple host processor 705 and wireless interface 730.

LLI stands for low latency interface. LLI typically enables memory sharing between two devices. A bidirectional interface transports memory transactions between two devices and allows a device to access the local memory of another device; often this is done without software intervention, as if it was a single device. LLI, in one embodiment, allows three classes of traffic, carrying signals over the link, reducing GPIO count. As an example, LLI defines a layered protocol stack for communication or a physical layer (PHY), such as an MPHY that is described in more detail below.

SSIC refers to SuperSpeed Inter-Chip. SSIC may enable the design of high speed USB devices using a low power physical layer. As an example, a MPHY layer is utilized, while USB 3.0 compliant protocols and software are utilized over the MPHY for better power performance.

UniPro describes a layered protocol stack with physical layer abstraction, providing a general purpose, error-handling, high speed solution for interconnecting a broad range of devices and components: application processors, co-processors, modems, and peripherals, as well as supporting different types of data traffic including control messages, bulk data transfer and packetized streaming. UniPro may support usage of an MPHY or DPHY.

Other interfaces may also couple directly to host processor 705, such as debug 790, Network 785, Display 770, camera 775, and storage 780 through other interfaces that may utilize the apparatus and methods described herein.

Debug interface 790 and network 785 communicates with application processor 705 through a debug interface 791, e.g. PTI, or network connection, e.g. a debug interface that operates over a functional network connection 785.

Display 770 includes one or more displays. In one embodiment, display 770 includes a display with one or more touch sensors capable of receiving/sensing touch input. Here, display 770 is coupled to application processor 705 through display interface (DSI) 771. DSI 771 defines protocols between host processor and peripheral devices, which may utilize a D-PHY physical interface. It typically adopts pixel formats and a defined command set for video formats and signaling, such as Display Pixel Interface 2 (DPI-2), and control display module parameters, such as through a Display Command Set (DCS). As an example, DSI 771 operates at approximately 1.5 Gb/s per lane or to 6 Gb/s.

Camera 775, in one embodiment, includes an image sensor used for still pictures, video capture, or both. Front and back side cameras are common on mobile devices. Dual-cameras may be used to provide stereoscopic support. As depicted, camera 775 is coupled to application processor 705 through a peripheral interconnect, such as CSI 776. CSI 776 defines an interface between a peripheral device (e.g. camera, Image Signal Processor) and a host processor (e.g. 705, baseband, application engine). In one embodiment, image data transfers are performed over a DPHY, a unidirectional differential serial interface with data and clock signals. Control of the peripheral, in on embodiment, occurs over a separate back channel, such as camera control. As an illustrative example, the speed of CSI may range from 50 Mbps-2 Gbps, or any range/value therein.

Storage 780, in one example, includes a non-volatile memory used by the application processor 705 to store large amounts of information. It may be based on Flash technology or a magnetic type of storage, such as a hard-disk. Here, 780 is coupled to processor 705 through Universal Flash Storage (UFS) interconnect 781. UFS 781, in one embodiment, includes an interconnect that is tailored for low power computing platforms, such as mobile systems. As an example, it provides between 200 and 500 MB/s transfer rate (e.g. 300 MB/s) utilizing queuing features to increase random read/write speeds. In one implementations, UFS 781 uses the MPHY physical layer and a protocol layer, such as UniPro.

Modem 710 often stands for Modulator/demodulator. The modem 710 typically provides the interface to the cellular network. It's capable of communicating with different networks types and different frequencies, depending on which communication standard is used. In one embodiment, both voice and data connections are supported. Modem 710 is coupled to host 705 utilizing any known interconnect, such as one or more of LLI, SSIC, UniPro, Mobile Express, etc.

In one embodiment, a control bus is utilized to couple control or data interfaces, such as wireless 735, speaker 740, microphone 745. An example of such a bus is SLIMbus; a flexible low-power multi-drop interface capable of supporting a wide range of audio and control solutions. Other examples include PCM, I2S, I2C, SPI, and UART. Wireless 735 includes an interface, such as a short range communication standard between two devices (e.g. Bluetooth or NFC), a navigation system capable of triangulating position and/or time (e.g. GPS), a receiver for analog or radio broadcasts (e.g FM Radio), or other known wireless interface or standard. Speaker(s) 740 includes any device to generate sound, such as an electromechanical device to generate ringtones or music. Multiple speakers may be used for stereo or multi-channel sound. Microphone 745 is often utilized for voice input, such as talking during a call.

Radio Frequency Integrated Circuit (RFIC) 715 is to perform analog processing, such as processing of radio signals, e.g. amplification, mixing, filtering, and digital conversion. As depicted, RFIC 715 is coupled to modem 710 through interface 712. In one embodiment, interface 712 includes a bi-directional, high-speed interface (e.g. DigRF) that supports communication standards, such as LTE, 3GPP, EGPRS, UMTS, HSPA+, and TD-SCDMA. As a specific example, DigRF utilizes a frame-oriented protocol based on a M-PHY physical layer. DigRF is typically referred to as RF friendly, low latency, low power with optimized pin count that currently operations between 1.5 or 3 Gbps per lane and is configurable with multiple lanes, such as 4 lanes.

Interface 761 (e.g. a RF control interface) includes a flexible bus to support simple to complex devices. As a specific example, interface 761 includes a flexible two-wire serial bus, designed for control of RF Front-End components. One bus master may write and read to multiple devices, such as power amplifier 750 to amplify the RF signal, sensors to receive sensor input, switch module(s) 760 to switch between RF signal paths depending on a network mode, and antenna tuners 765 to compensate for bad antenna conditions or enhancing bandwidth. Interface 761, in one embodiment, has a group trigger function for timing-critical events and low EMI.

Power management 720 is used to provide all the different components in the mobile device 700 with power managed voltage, such as decreasing voltage or increasing it to improve efficiency for components in the mobile device. In one embodiment, it also controls and monitors the charge of the battery and remaining energy. A battery interface may be utilized between power management 720 and the battery. As an illustrative example, the battery interface includes a single-wire communication between a mobile terminal and smart/low cost batteries.

In one embodiment, an integrated circuit includes a hierarchical network of modular functional blocks. The output of each functional block can be logically determined by its external inputs combined with internal state feedback. Internal state is derived from a pattern of prior external inputs. Alignment of output conditions is induced from independent and interdependent functional blocks within the hierarchical network of functional blocks to provide unique conditions by controlling internal override logic that receives internal control/data signals that modify internal state. Timing alignments within one or more of the modular functional blocks is modified.

Functional outputs from one or more of the modular functional blocks are modified based on the modified internal state and timing alignments. Pattern results are generated based on the monitoring. Test results based on the pattern results are stored.

In one embodiment, modifying internal state and timing alignments includes causing at least one sequence of periodic stalls to at least one internal condition within one or more modular functional blocks. In one embodiment, modifying internal state and timing alignments includes causing at least one forced stall to at least one internal condition within one or more modular functional blocks in response to detection of a preselected set of conditions.

In one embodiment, modifying internal state and timing alignments includes controlling backpressure for one or more modular functional blocks. In one embodiment, controlled back pressure delays functional outputs from one or more of the modular functional blocks to align selected inputs to a lower level target modular functional block.

In one embodiment, internal data and internal controls are provided from a cache. In one embodiment, modifying internal state and timing alignments includes causing at least one random stall to at least one internal condition within one or more modular functional blocks.

In one embodiment, an integrated circuit includes a hierarchical network of modular functional blocks. The output of each functional block can be logically determined by its external inputs combined with internal state feedback. Internal state is derived from a pattern of prior external inputs. In one embodiment, the integrated circuit is designed to induce alignment of output conditions from independent and interdependent functional blocks within the hierarchical network of functional blocks to provide unique conditions by modifying internal state and timing alignments with internal data and internal controls within one or more of the modular functional blocks.

In one embodiment, the integrated circuit is designed also to monitoring functional outputs from one or more of the modular functional blocks based on the modified internal state and timing alignments. In one embodiment, the integrated circuit is designed also to generate pattern results based on the monitoring, and to store test results based on the pattern results.

In one embodiment, modifying internal state and timing alignments includes causing at least one sequence of periodic stalls to at least one internal condition within one or more modular functional blocks. In one embodiment, modifying internal state and timing alignments includes causing at least one forced stall to at least one internal condition within one or more modular functional blocks in response to detection of a preselected set of conditions.

In one embodiment, modifying internal state and timing alignments includes controlling backpressure for one or more modular functional blocks. In one embodiment, controlled back pressure delays functional outputs from one or more of the modular functional blocks to align selected inputs to a lower level target modular functional block.

In one embodiment, internal data and internal controls are provided from a cache. In one embodiment, modifying internal state and timing alignments includes causing at least one random stall to at least one internal condition within one or more modular functional blocks.

In one embodiment, an integrated circuit includes a hierarchical network of modular functional blocks. The output of each functional block can be logically determined by its external inputs combined with internal state feedback. Internal state is derived from a pattern of prior external inputs. In one embodiment, alignment of output conditions from independent and interdependent functional blocks is to be induced within the hierarchical network of functional blocks to provide unique conditions by controlling internal override logic that receives internal control/data signals that modify internal state and timing alignments within one or more of the modular functional blocks.

In one embodiment, random input patterns are provided to one or more of the modular functional blocks to generate pattern results. In one embodiment, test results based on the pattern results are stored.

In one embodiment, internal data and internal controls are provided from a cache. In one embodiment, internal data and internal controls are generated in response to the pattern results.

In one embodiment, an integrated circuit has a hierarchical network of modular functional blocks. The output of each functional block can be logically determined by its external inputs combined with internal state feedback. Internal state is derived from a pattern of prior external inputs. In one embodiment, the integrated circuit is to induce alignment of output conditions from independent and interdependent functional blocks within the hierarchical network of functional blocks to provide unique conditions by modifying internal state and timing alignments with internal data and internal controls within one or more of the modular functional blocks. In one embodiment, the integrated circuit is to store test results based on the pattern results.

In one embodiment, internal data and internal controls are provided from a cache. In one embodiment, internal data and internal controls are generated in response to the pattern results.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   modifying, with internal override logic, internal state and timing alignments within one or more functional blocks within a hierarchical network of module functional blocks within an integrated circuit;

inducing alignment of output conditions from independent and interdependent functional blocks within the hierarchical network of modular functional blocks to provide unique conditions;

monitoring functional outputs from the one or more of the modular functional blocks based on the modified internal state and timing alignments;

generating pattern results based on the monitoring of the functional outputs; and storing test results based on the pattern results.

2. The method of claim 1 wherein modifying internal state and timing alignments comprises causing at least one sequence of periodic stalls to at least one internal condition within one or more modular functional blocks.

3. The method of claim 1 wherein modifying internal state and timing alignments comprises causing at least one forced stall to at least one internal condition within one or more modular functional blocks in response to detection of a preselected set of conditions.

4. The method of claim 1 wherein modifying internal state and timing alignments comprises controlling backpressure for one or more modular functional blocks.

5. The method of claim 4 wherein the controlled back pressure delays functional outputs from one or more of the modular functional blocks to align selected inputs to a lower level target modular functional block.

6. The method of claim 1 wherein internal data and internal controls are provided from a cache.

7. The method of claim 1 wherein modifying internal state and timing alignments comprises causing at least one random stall to at least one internal condition within one or more modular functional blocks.

8. An apparatus comprising:
an integrated circuit to be logically organized in a hierarchical network of modular functional blocks, the integrated circuit comprising,
internal override logic to override internal state and alignment for one or more functional blocks of the hierarchical network of modular functional blocks and to induce alignment of output conditions from independent and interdependent functional blocks within the hierarchical network of functional blocks to provide unique conditions,
testing logic coupled to the hierarchical network of modular functional blocks to monitor functional outputs from the one or more functional blocks based on the internal state and timing alignments, to generate pattern results based on the monitoring, and to store test results based on the pattern results.

9. The apparatus of claim 8 wherein modifying internal state and timing alignments comprises causing at least one sequence of periodic stalls to at least one internal condition within one or more modular functional blocks.

10. The apparatus of claim 8 wherein modifying internal state and timing alignments comprises causing at least one forced stall to at least one internal condition within one or more modular functional blocks in response to detection of a preselected set of conditions.

11. The apparatus of claim 8 wherein modifying internal state and timing alignments comprises controlling backpressure for one or more modular functional blocks.

12. The apparatus of claim 11 wherein the controlled back pressure delays functional outputs from one or more of the modular functional blocks to align selected inputs to a lower level target modular functional block.

13. The apparatus of claim 8 wherein internal data and internal controls are provided from a cache.

14. The apparatus of claim 8 wherein modifying internal state and timing alignments comprises causing at least one random stall to at least one internal condition within one or more modular functional blocks.

15. A method comprising:
in an integrated circuit having a hierarchical network of modular functional blocks, where the output of each functional block is logically determined by its external inputs combined with internal state feedback and internal state is derived from a pattern of prior external inputs, inducing alignment of output conditions from independent and interdependent functional blocks within the hierarchical network of functional blocks to provide unique conditions by controlling internal override logic that receives internal control/data signals that modify internal state and timing alignments within one or more of the modular functional blocks;
providing random input patterns to one or more of the modular functional blocks to generate pattern results; and
storing test results based on the pattern results.

16. The method of claim 15 wherein internal data and internal controls are provided from a cache.

17. The method of claim 15 further comprising generating internal data and internal controls in response to the pattern results.

18. A system comprising an integrated circuit die having internal override logic to override internal state and alignment for one or more functional blocks of the hierarchical network of modular functional blocks and to induce alignment of output conditions from independent and interdependent functional blocks within the hierarchical network of functional blocks to provide unique conditions, testing logic coupled to the hierarchical network of modular functional blocks to monitor functional outputs from the one or more functional blocks based on the internal state and timing alignments, to generate pattern results based on the monitoring, and to store test results based on the pattern results and an interface to receive touch-sensitive input.

19. The system of claim 18 wherein modifying internal state and timing alignments comprises controlling backpressure for one or more modular functional blocks.

20. The system of claim 19 wherein the controlled back pressure delays functional outputs from one or more of the modular functional blocks to align selected inputs to a lower level target modular functional block.

* * * * *